United States Patent
Thoren et al.

(10) Patent No.: US 8,766,643 B2
(45) Date of Patent: Jul. 1, 2014

(54) METHOD FOR MONITORING REMAINING SERVICE LIFE OF A BATTERY

(75) Inventors: Werner Thoren, Steinen (DE); Christian Seiler, Auggen (DE); Stefan Probst, Weil am Rhein (DE); Ingo Laible, Arlesheim (CH)

(73) Assignee: Endress + Hauser Process Solutions AG, Reinach (CH)

( * ) Notice: Subject to any disclaimer, the term of this patent is extended or adjusted under 35 U.S.C. 154(b) by 826 days.

(21) Appl. No.: 12/452,116

(22) PCT Filed: Aug. 6, 2009

(86) PCT No.: PCT/EP2009/060176
§ 371 (c)(1), (2), (4) Date: Jun. 25, 2010

(87) PCT Pub. No.: WO2010/018116
PCT Pub. Date: Feb. 18, 2010

(65) Prior Publication Data
US 2010/0283472 A1  Nov. 11, 2010

(30) Foreign Application Priority Data
Aug. 11, 2008 (DE) .......................... 10 2008 037 193

(51) Int. Cl.
*G01N 27/416* (2006.01)

(52) U.S. Cl.
USPC ............ 324/427; 324/426; 324/433; 320/130

(58) Field of Classification Search
USPC ................................................ 324/433, 427
See application file for complete search history.

(56) References Cited

U.S. PATENT DOCUMENTS

| | | | |
|---|---|---|---|
| 4,488,440 A | | 12/1984 | Watson |
| 5,065,084 A | * | 11/1991 | Oogita .......................... 320/136 |
| 5,136,246 A | * | 8/1992 | Sakamoto ...................... 324/433 |
| 5,372,898 A | * | 12/1994 | Atwater et al. ................. 429/90 |
| 5,698,971 A | * | 12/1997 | Sahai et al. .................... 323/282 |
| 5,900,734 A | * | 5/1999 | Munson ......................... 324/433 |
| 6,020,718 A | * | 2/2000 | Ozawa et al. .................. 320/116 |
| 6,064,183 A | * | 5/2000 | Akizuki et al. ................ 320/132 |
| 6,449,726 B1 | | 9/2002 | Smith |
| 6,903,659 B2 | | 6/2005 | Vanderah |
| 7,218,078 B2 | * | 5/2007 | Gagnon et al. ................ 320/132 |
| 7,459,912 B2 | * | 12/2008 | Suzuki et al. ................. 324/427 |
| 7,593,822 B2 | * | 9/2009 | Stewart .......................... 702/63 |
| 2004/0090207 A1 | | 5/2004 | Ooi |
| 2005/0070073 A1 | | 3/2005 | Al-Bayati |

FOREIGN PATENT DOCUMENTS

| | | |
|---|---|---|
| DE | 41 31 981 | 4/1993 |
| DE | 103 28 532 | 12/2004 |
| DE | 10 2005 051 795 | 5/2007 |

(Continued)

*Primary Examiner* — Richard Isla Rodas
(74) *Attorney, Agent, or Firm* — Bacon & Thomas, PLLC

(57) ABSTRACT

A method for monitoring the remaining service life of a battery used for operating a field device in automation technology. The present power consumption of the battery is ascertained. Then, during a first phase of life, power consumption of the battery ascertained during operation of the field device is compared with a predetermined threshold value. In the case of exceeding the predetermined threshold value, during a second phase of life, the battery is exposed to defined load spikes at predetermined time intervals. Voltage collapses corresponding to the defined load spikes are detected, and a warning report is generated when the voltage collapses reach a predetermined maximum limit value.

14 Claims, 2 Drawing Sheets

(56) References Cited

FOREIGN PATENT DOCUMENTS

| DE | 10 2006 055 125 | 6/2008 |
|---|---|---|
| EP | 1933 116 A2 | 6/2008 |
| GB | 2 220 497 | 1/1990 |
| GB | 2 324 606 | 10/1998 |
| WO | WO 2004/082054 | 9/2004 |
| WO | WO 2004/092685 | 10/2004 |
| WO | WO 2005/103851 | 11/2005 |

* cited by examiner

METHOD FOR MONITORING REMAINING SERVICE LIFE OF A BATTERY

TECHNICAL FIELD

The invention relates to a method for monitoring the remaining service life of a battery, particularly a disposable battery, used to power a field device in automation technology.

BACKGROUND DISCUSSION

In process automation technology, field devices are often employed, which serve to register and/or influence process variables. Serving for registering process variables are sensors, such as, for example, fill-level measuring devices, flow measuring devices, pressure and temperature measuring devices, pH-redox potential measuring devices, electrical conductivity measuring devices, etc., which register the respective process variables, fill-level, flow, pressure, temperature, pH-value and conductivity. Serving for influencing process variables are actuators, for example valves or pumps, via which the flow of a fluid in a section of pipeline or the fill-level in a container can be changed. In principle, all devices which are employed near the process and which deliver or work with process-relevant information are referred to as field devices. In addition to the aforementioned sensors and actuators, generally, units that are directly connected to a fieldbus and which serve to communicate with the superordinated units (e.g. remote I/Os, gateways, linking devices and wireless adapters) are also referred to as field devices. A large number of these devices are produced and sold by the Endress+Hauser Group.

In modern industrial facilities, field devices are, as a rule, connected with superordinated units via fieldbus systems (e.g. Profibus®, Foundation Fieldbus®, HART®, etc.). Normally, the superordinated units involve control systems or control units, for example a PLC (programmable logic controller). The superordinated units are used, for example, for process control, process visualizing, process monitoring as well as in the start-up of the field devices. The measurement values registered by the field devices—especially from the sensors—are transmitted via the connected bus system to a superordinated unit, or, as the case may be, to several superordinated units. Additionally, a transfer of data from the superordinated unit to the field devices via the bus system is necessary; this is used especially in the configuring and parametering of field devices or for diagnostic purposes. Generally speaking, the field device is serviced from the superordinated unit via the bus system.

In addition to a hardwired data transmission between the field devices and the superordinated unit, the possibility of a wireless data transmission also exists. In particular in the case of the bus systems Profibus®, Foundation Fieldbus® and HART®, a wireless data transmission via radio is specified. Additionally, radio networks for sensors are more precisely specified in the standard IEEE 802.15.4. For the realization of a wireless transmission of data, field devices are designed for example as radio-field devices. As a rule, these exhibit a radio unit and an electrical current source as integral components. In such a case, the radio unit and the electrical current source can be provided in the field device itself, or in a radio module which is permanently connected to the field device. Through the electrical current source, an autarkic energy supply for the field device is made possible.

Furthermore, there exists the possibility to equip field devices without radio units—i.e. the current installed base in the field—to become a radio-field device through the attachment of a wireless adapter which features a radio unit. A corresponding wireless adapter is described, for example, in the international publication WO 2005/103851 A1. The wireless adapter is, as a rule, connected to a fieldbus communication interface of the field device in a detachable manner. Via the fieldbus communication interface, the field device can transmit data over the bus system to the wireless adapter, which then transmits this via radio to the target location. Conversely, the wireless adapter can receive data via radio and forward it over the fieldbus communication interface to the field device. The supplying of the field device with electrical power then occurs as a rule via an energy supply unit associated with the wireless adapter.

@In the case of autarkic radio field devices and wireless adapters, the communication (for example with a superordinated unit) is, as a rule, conducted via a wireless interface of the radio field device or the wireless adapter. Additionally, such radio field devices or wireless adapters exhibit as a rule a hardwired communication interface. The HART Standard, for example, provides that the radio field device must, in addition to a wireless interface, also feature a hardwired communication interface. Via such a hardwired communication interface, an on-site configuration of the radio field device or wireless adapter is, for example, possible via a service or operating unit (for example a handheld communicator) which is connected to the hardwired communication interface. Furthermore, the hardwired communication interface can be embodied as a fieldbus communication interface, so that the communication is conducted through it according to a bus system, e.g. according to one of the standardized bus systems such as Profibus, Foundation Fieldbus or HART. Through such a fieldbus communicating interface, the radio field device or wireless adapter can also be connected to a corresponding hardwired fieldbus.

The energy supply unit or electrical current source of a wireless adapter or a radio field device is normally a battery. The charge status of batteries is, according to the state of the art, determined via a measurement of consumption, which is performed by means of a coulomb counter. Performing a so-called end of life (EOL) detection is also known. The corresponding components are available on the market.

Disadvantageous for determining the remaining service life of the battery from the measurement of consumption is the relatively high inaccuracy. This is especially the case if the charge status of the battery is not precisely known at the beginning of its use—a problem which arises, for example, in the case of a battery which has previously been used, or due to the differing charge statuses which also occur in the case of unused batteries.

The problem encountered in EOL detection can be seen in that in the case of batteries with a flat characteristic curve (U/t), a reliable prediction of the remaining service life is not possible. Additionally, further demand is made on the battery by the EOL detection.

SUMMARY OF THE INVENTION

An object of the invention is to make possible a reliable determining of the remaining service life of a battery used for supplying energy to an autarkic field device or a radio adapter in the automation technology field.

The object is achieved by features as follows: the present power consumption of the battery is ascertained; during a first phase of life, power consumption of the battery ascertained during operation of the field device is compared with a predetermined threshold value; in the case of exceeding the predetermined threshold value, the battery is exposed during a second phase of life to defined load spikes at predetermined time intervals; voltage collapses corresponding to the defined load spikes are detected; and a warning report is generated when the voltage collapses reach a predetermined maximum limit value. Thus, both a consumption calculation as well as an EOL detection are used. In such case, external influences, such as e.g. the influence of temperature, which have an effect on the service life of the battery, are automatically taken into account. Since the EOL detection first begins after a defined consumption threshold has been exceeded, the additional demand on the battery is reduced considerably. Due to the invention, it is possible that a change of batteries can occur in a timely and planned manner. Reliable operation of a battery-powered field device is thus assured at all times.

In order to increase the service life of the battery, the demand on the battery is reduced by the featire that the field device and, in given cases, the radio adapter, which are fed by the battery, are operated intermittently between operating phases and resting phases.

In a first embodiment of the method of the invention, during the operation of the field device, the electrical current provided by the battery is ascertained and integrated over the time; subsequently, on the basis of the ascertained values, the power consumption of the field device or the remaining power capacity of the battery is ascertained.

It is alternatively provided that, during the operating phases, the field device is operated in various operating states, and that a defined power consumption of the battery or a battery type is associated with every operating state of the field device. For example, the respective power consumptions of the different operating states of the battery or battery type are empirically ascertained or calculated.

It is further more provided in an advantageous embodiment of the method of the invention that the power consumption of the battery or respective battery type is stored as a function of the arising operating states or is ascertained in the operating phase, and that the reaching of the predetermined threshold value is signaled when the sum of the power consumptions of the arising operating states reaches or exceeds the upper threshold value.

It is, moreover, proposed that the upper threshold value is signaled when the power capacity of the battery falls to at least half of the power capacity available in the battery's unused state. Other fractions of the power capacity can of course also be applied in connection with the method of the invention.

A further alternative provides that the total consumption of the battery or battery type over its lifespan is stored as a function of the process conditions reigning at the location of use of the battery.

It is seen as especially advantageous in connection with the invention when an optimized threshold value is ascertained as a function of the ascertained lifespan of the battery in the process conditions reigning at the location of use.

In an advantageous embodiment of the method of the invention, a bench-marking can be performed: The overall consumption at the end of the battery's life is used for calculating remaining run time and for optimizing the threshold value during usage of the following battery of the same type.

A preferred further development of the method of the invention provides that the time intervals, in which the battery is exposed to defined overload spikes, are varied.

It is additionally or alternatively provided that the size of the overload spikes is varied as a function of the particular power status of the battery. In this way, the demand on the battery is likewise lessened.

It is furthermore proposed that, taking into consideration the respective operating states of the field device, a remaining run time for the operation of the field device is determined from the difference between the present power consumption and the power capacity of the battery.

BRIEF DESCRIPTION OF THE DRAWINGS

The invention will now be explained in greater detail on the basis of the appended drawing, the figures of which show as follows.

DETAILED DISCUSSION IN CONJUNCTION WITH THE DRAWINGS

Figure 1:
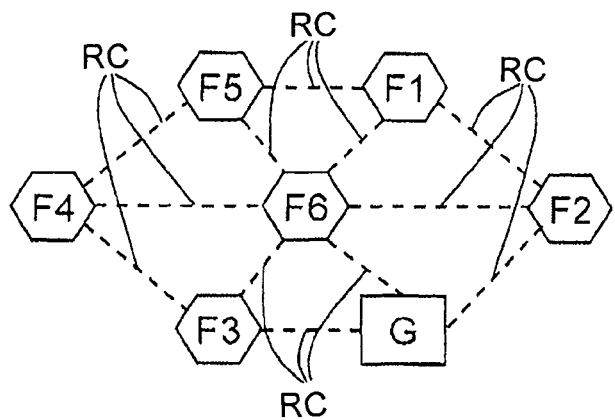
FIG. 1 is a schematic representation of a radio network with several field devices.

In FIG. 1, a radio network is shown with several field devices F1, F2, ..., F6 (each of which is embodied as a radio field device) and a gateway G. The field devices F1, F2, ..., F6 are connected with each other and with the gateway G by radio conections RC, which are represented in FIG. 1 by the dashed lines. Since the field devices F1, F2, ..., F6 and the gateway G can communicate with one another over several radio connections RC, even in the case of the failure of one radio connection RC, communication is still maintained through one of the other radio connections RC. The frequency hopping spread spectrum (FHSS) or direct sequence spread spectrum (DSSS) methods, for example, are suitable as radio transmission technologies for the radio connections RC. Due to the required low transmission powers, UltraWideBand technology (UWB) is also quite well-suited. The gateway G can be a long distance transmission unit, e.g. the product "Fieldgate" of the firm, Endress+Hauser. In such case, gateway G can communicate with a superordinated unit either worldwide (for example via the Internet), GSM or through the public switched telephone network. Furthermore, a superordinated unit (not shown) or a control device (not shown) can also directly communicate with the illustrated radio network via a corresponding radio connection.

Figure 2:
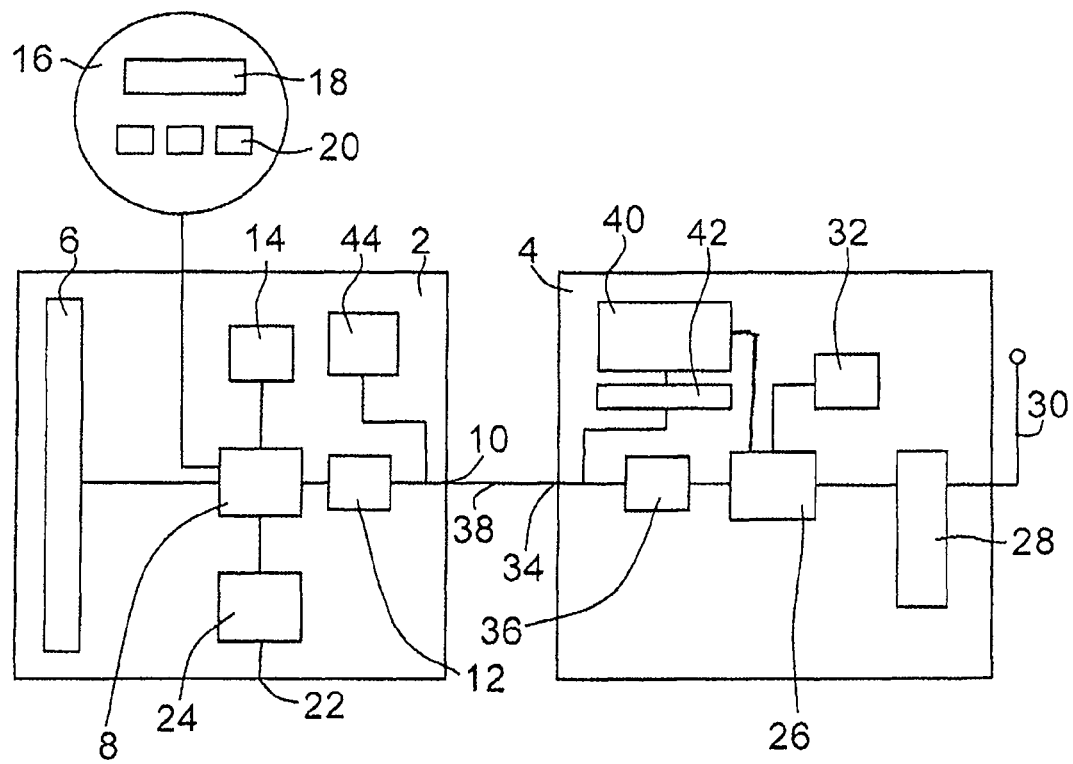
FIG. 2 is a block diagram of a field device and a connected wireless adapter.

Shown in the block diagram of FIG. 2 are a traditionally embodied field device 2 and an attached wireless adapter 4. By the attachment of the wireless adapter 4, the field device 2 can be upgraded to a radio field device, for example a field device F1, F2, ..., F6 as shown in FIG. 1. Field device 2 exhibits a measured value transducer 6 and a control unit, which is embodied as a microprocessor 8. The measured value transducer 6 and the microprocessor 8 are in communication with each other. The field device 2 further exhibits a hardwired HART communication interface 10 (for example, in accordance with the HART standard), which is connected with the microprocessor 8. Associated with the HART communication interface 10 is a functional unit 12 in the form of an ASIC (application specific integrated circuit), which is responsible for transmission and/or reception of digital signals (according to the HART standard) via the HART communication interface 10. Via the HART communication interface 10, the field device 2 can also, as an alternative to the shown connection with the wireless adapter 4, be connected to a hardwired HART fieldbus system.

The field device 2 furthermore includes a data storage unit 14, in which, among other things, parameters of the field device 2 are stored. Data storage unit 14 is accessed via the microprocessor 8. For the onsite servicing of the field device 2, there is provided at the field device a display and service unit 16, which includes a display unit 18 and a service unit 20 (in the form of a keypad), and which is in communication with the microprocessor 8. An onsite servicing of the field device 2 can also be performed with a servicing device (not shown). For this purpose, a service interface 22, which in communication with the microprocessor 8, is provided on the field device 2. Communication via the service interface 22 is manufacturer-specific, i.e., it does not occur according to a standardized fieldbus protocol. Associated with the service interface 22, in turn, is a functional unit 24 in the form of an ASIC, via which transmission and/or reception of digital signals according to the manufacturer-specific communication is performed via the service interface 22.

The wireless adapter 4 likewise includes a control unit in the form of a microprocessor 26. For the exchange of data over the radio network, the microprocessor 26 is connected with a radio unit 28, which includes an RF chipset and an antenna 30. The radio unit 28 is designed in such a way that a wireless communication occurs according to the HART standard. Microprocessor 26 is also connected with a data storage unit 32, in which, among other things, the parameters of the wireless adapter 4 are stored. For communicating with the field device 2, the wireless adapter 4 includes a hardwired HART communication interface 34, with which, in turn, is associated a functional unit 36, which performs the transmission and/or reception of digital signals (according to the HART standard) via the HART communication interface 34. Functional unit 36 is again an ASIC. In the case of the arrangement shown in FIG. 2, the HART communication interface 10 of the field device 2 and the HART communication interface 34 of the wireless adapter 4 are connected with each other via a 2-conductor connecting line 38. Over this connection occurs both the communication between the field device 2 and the wireless adapter 4 as well as also the supplying of the field device 2 with power by the wireless adapter 4.

For providing the field device 2 (and the wireless adapter 4) with power, the wireless adapter 4 includes a power source in the form of a battery 40 and a voltage converter 42, which is attached to the battery 40. Through the voltage converter 42, the system components of the wireless adapter 4 (via electrical current supply lines not shown)—as well as the system components of the field device 2 via the HART communication interface 34, the 2-conductor-connecting line 38, the HART communication interface 10 and a thereto connected voltage converter 44 of the field device 2—are supplied with electrical power.

The monitoring of the battery 40 in accordance with the method of the invention occurs via the microprocessor 26.

Although the drawing displays a field device 2 which is upgraded to an autarkic radio field device through a radio adapter 4, the method for detecting the charge status of the battery 40 of the invention can, of course, be used with an autarkic field device 2. In such case, the battery 40, the radio module 28 and the antennae 30 are directly integrated into the field device 2.

Figure 3:
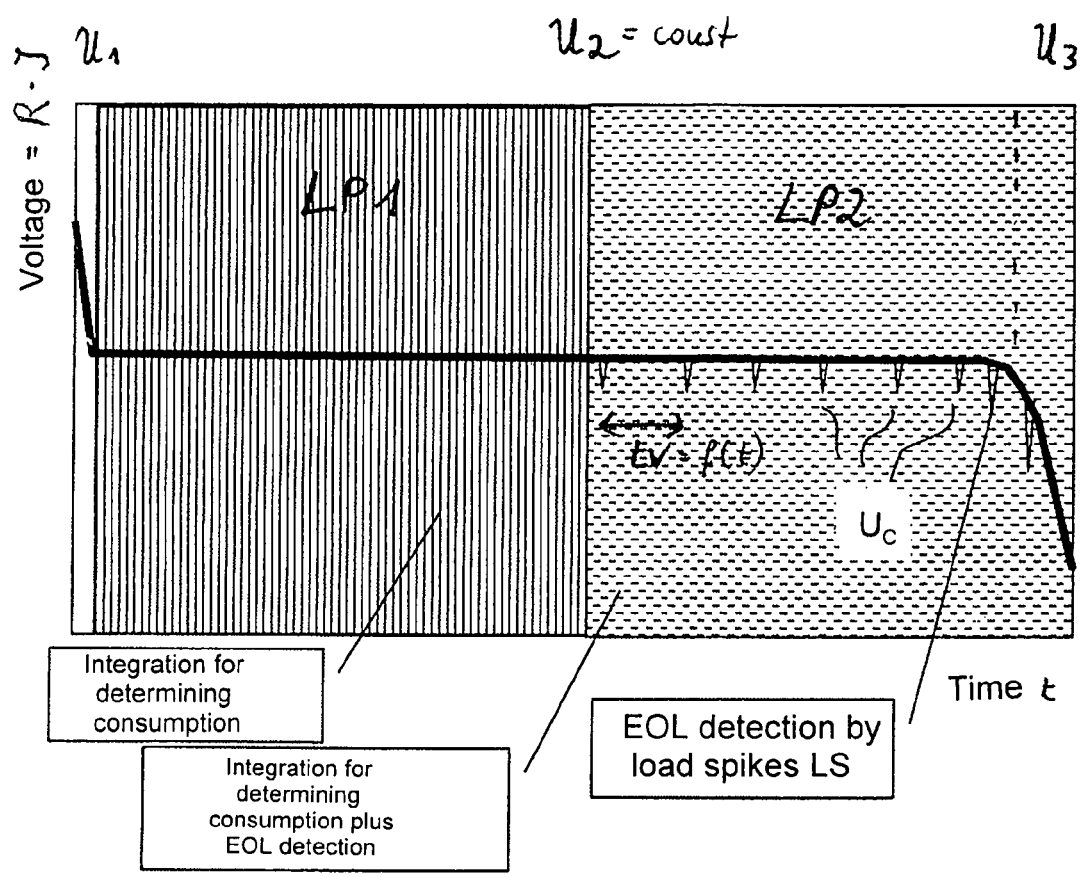
FIG. 3 is a typical discharge curve of a battery, wherein a special embodiment of the method of the invention is shown in the context of the discharge curve.

FIG. 3 shows a typical discharge curve for a battery 40. At the beginning of its lifespan, the battery 40 delivers a high voltage $U1(t)$, which after a relatively short time levels off to an at least approximately constant value $U2(t)$=const. For the greater part of its life, the battery 40 delivers the constant voltage U2. Toward the end of the service life, the voltage $U3(t)$ of the battery 40 sinks relatively quickly, so that the battery 40, upon subceeding, or falling beneath, a predetermined minimal voltage, is completely lost as an energy source. Since a sudden failure of the battery leads to a failure of the field device 2 and, as the case may be, to a stopping of the process plant in which the field device 2 is integrated, an early indication must be delivered that announces the end of the lifespan/service life of the battery 40.

In addition to the typical discharge curve $U(t)$ of the battery 40, FIG. 3 also shows a preferred embodiment of the method of the invention. In accordance with the invention, in various regions of the discharge curve $U(t)$, the application of different measures for the detection of the particular level of discharge of the battery 40 are provided. Especially, the present power consumption of the battery 40 is ascertained at particular time intervals over the lifespan of the battery. During the first phase of life LP1, the power consumption of the battery 40 ascertained during the operation of the field device 2 is compared with a predetermined threshold value. As soon as this predetermined threshold value of the battery 40 is exceeded, the battery 40 enters its second phase of life LP2. During this second phase of life LP2, the battery 40 is exposed by the microprocessor 26 to defined load spikes at predetermined time intervals tv. The levels UC, to which the voltage of the battery 40 collapses at these load spikes, are detected. A warning report is generated when the level UC of voltage collapse reaches a predetermined maximum limit value. The warning report subsequently leads to, for example, a report on the display unit 18, or a transmission occurs to the superordinated control unit.

Preferably, during the operation of the field device 2, the electrical current 1 supplied by the battery 40 is ascertained and integrated over the time. By means of the ascertained values, the power consumption of the field device 2 or the remaining power capacity of the battery 40 is subsequently ascertained.

Alternatively, during the phases of operation, the field device 2 is operated in various operating states, wherein there is associated with each operating state of the field device 2 a defined power consumption of the battery 40 or of a battery type. Typical operations here are the start-up of the field device 2, its parametering, and the measured value query. For example, the power consumptions of the various operating states of the battery 40 or battery type can be empirically ascertained and calculated.

It is also advantageous to record the power consumption of the battery 40 or its respective battery type as a function of the arising operating states, or to ascertain it in the operating phases, wherein the reaching of the predetermined threshold value is signaled when the sum of the power consumptions of the arising operating states reaches or exceeds the upper threshold value. For example, the reaching of the upper threshold value is signaled when the power capacity of the battery 40 has fallen to at least half of the power capacity of the battery 40 in its unused state.

For the purpose of saving energy and, associated therewith, for lengthening the service life of the battery 40, during the second phase of life of the battery 40, the time intervals, in which the battery 40 is expose to defined overload spikes, are varied. Thus, the intervals, in which the overload spikes are applied to the battery 40, for example, decease from the beginning to the end of the second phase of life LP2. Moreover, it is provided that the size of the overload spikes is varied as a function of the power status of the battery 40.

The invention claimed is:

1. A method for monitoring the remaining service life of a battery used during operation of a field device in automation technology, wherein the field device is operated in various operating states and associated with each operating state of the field device is stored a defined power consumption of the battery as a function of the arising operating states, and wherein the method uses both a consumption calculation during a first phase of life as well as an End-of-Life detection during a second phase of life, comprising the steps of:

during the first phase of life, comparing the calculated sum of the power consumptions of the arising operating states of the field device with a predetermined threshold value;

entering a second phase of life when the sum of the calculated power consumptions of the arising operating states of the field device exceeds the predetermined threshold value;

during the second phase of life, exposing the battery to defined overload spikes at predetermined time intervals;

detecting voltage collapses corresponding to the defined overload spikes; and generating a warning report when the voltage collapses reaches a predetermined maximum limit value.

2. The method as claimed in claim 1, further comprising the step of:

operating the field device intermittently between operating phases and resting phases.

3. The method as claimed in claim 2, wherein:

power consumption of the battery or the respective battery type is stored as a function of the arising operating states or ascertained during the operating phase; and reaching of the predetermined threshold value is signaled when the sum of the power consumptions of arising operating states reaches or exceeds the upper threshold value.

4. The method as claimed in claim 1, further comprising the steps of:

ascertaining during operating of the field device, electrical current provided by the battery and integrated over time; and ascertaining by means of the ascertained values, power consumption of the field device or remaining power capacity of the battery.

5. The method as claimed in claim 1, wherein:

during operating phases, the field device is operated in various operating states; and a defined power consumption of the battery or a battery type is associated with each operating state of the field device.

6. The method as claimed in claim 5, wherein:

power consumptions of the various operating states of the battery or battery type are empirically ascertained or calculated.

7. The method as claimed in claim 1, wherein:

the upper threshold value is signaled when the power capacity of the battery falls to at least half of the power capacity available to the battery in its unused state.

8. The method as claimed in claim 1, wherein:

total consumption of the battery or battery type over its lifespan is stored as a function of process conditions reigning at the location of use of the battery.

9. The method as claimed in claim 8, wherein:

an optimized threshold value is ascertained as a function of ascertained lifespan of the battery under process conditions reigning at the location of use.

10. The method as claimed in claim 9, wherein:

total power consumption at the end of the life of the battery is used for calculating and optimizing the threshold value for use of a following battery of the same type.

11. The method as claimed in claim 1, wherein:

time intervals, in which the battery is exposed to defined overload spikes, are varied.

12. The method as claimed in claim 1, size of the overload spikes is varied as a function of the power status of the battery.

13. The method as claimed in claim 1, wherein:

from the difference between present power consumption and the capacity of the battery, a remaining run time for operation of the field device is determined taking into consideration each of the operating states of the field device.

14. The method as claimed in claim 1, wherein:

the size of the overload spikes is varied as a function of the particular power status of the battery, so that the demand on the battery is likewise lessened.

* * * * *